United States Patent
Adamiecki et al.

[11] Patent Number: 5,974,302
[45] Date of Patent: Oct. 26, 1999

[54] DUAL BAND CELLULAR/PCS TRANSCEIVER

[75] Inventors: Andrew L. Adamiecki, Eatontown, N.J.; William J. Garner, Yardley, Pa.; Winston H. Lieu, Somerset, N.J.

[73] Assignee: Lucent Technologies Inc., Murray Hill, N.J.

[21] Appl. No.: 08/823,465

[22] Filed: Mar. 24, 1997

[51] Int. Cl.[6] .................................................. H04B 1/40
[52] U.S. Cl. .............................. 455/84; 455/76; 455/118
[58] Field of Search ................................ 455/78, 79, 82, 455/83, 84, 86, 118, 127, 129, 142, 180.1, 180.2, 188.1, 190.1, 207, 112, 113

[56] References Cited

U.S. PATENT DOCUMENTS

| | | | |
|---|---|---|---|
| 5,390,363 | 2/1995 | Mirtich et al. .............................. | 455/75 |
| 5,519,885 | 5/1996 | Vaisanen ................................... | 455/86 |
| 5,689,817 | 11/1997 | Fok ............................................ | 455/79 |
| 5,722,053 | 2/1998 | Kornfield et al. ........................ | 455/86 |
| 5,732,330 | 3/1998 | Anderson et al. ........................ | 455/76 |

*Primary Examiner*—Thanh Cong Le
*Assistant Examiner*—Sam Bhattacharya

[57] ABSTRACT

A transceiver operable in both the cellular and PCS frequency bands which uses a single voltage controlled local oscillator in an intermediate frequency stage for both the cellular and PCS signals. The oscillator is operative for upconverting transmitter signals and downconverting receive signals for both cellular operation and PCS operation. A second voltage controlled local oscillator in a stage between the transceiver antenna and the intermediate frequency stage is operative for only PCS operation to upconvert PCS transmitter signals and to downconvert PCS receive signals. This is accomplished by the use of a switchable intermediate frequency local oscillator in the transmitter path of both the cellular and PCS signals.

7 Claims, 2 Drawing Sheets

FIG. 2

| PCS CHANNEL NUMBER | TRANSMIT FREQ (MHz) | RECEIVE FREQ (MHz) | UPCONVERTED PCS TRANSMITTER SIGNAL FREQ (MHz) | PCS VCO LO FREQ (MHz) | DOWNCONVERTED PCS RECEIVED SIGNAL FREQ (MHz) | PCS & CELL VCO LO FREQ (MHz) |
|---|---|---|---|---|---|---|
| ... | ... | ... | ... | ... | ... | ... |
| 4 | 1850.10 | 1930.14 | 814.200 | 1035.90 | 894.240 | 976.440 |
| 5 | 1850.13 | 1930.17 | 814.230 | 1035.90 | 894.270 | 976.470 |
| 6 | 1850.16 | 1930.20 | 814.080 | 1036.08 | 894.120 | 976.320 |
| 7 | 1850.19 | 1930.23 | 814.110 | 1036.08 | 894.150 | 976.350 |
| 8 | 1850.22 | 1930.26 | 814.140 | 1036.08 | 894.180 | 976.380 |
| 9 | 1850.25 | 1930.29 | 814.170 | 1036.08 | 894.210 | 976.410 |
| 10 | 1850.28 | 1930.32 | 814.200 | 1036.08 | 894.240 | 976.440 |
| 11 | 1850.31 | 1930.35 | 814.230 | 1036.08 | 894.270 | 976.470 |
| 12 | 1850.34 | 1930.38 | 814.080 | 1036.26 | 894.120 | 976.320 |
| ... | ... | ... | ... | ... | ... | ... |

DUAL BAND CELLULAR/PCS TRANSCEIVER

BACKGROUND OF THE INVENTION

This invention relates to telecommunications devices and, more particularly, to an improved transceiver operable in both the cellular and PCS frequency bands.

In recent years, portable handheld wireless communications devices have become increasingly popular. At the present time, cellular telephones operating in the frequency band of about 824 MHz through about 894 MHz are the most widespread type of such devices. However, the personal communications system (PCS) operating in the frequency band of about 1850 MHz through about 1990 MHz is gaining in popularity. Accordingly, equipment suppliers are developing portable handheld radio transceivers which operate in both these frequency bands. Thus, there exists a need for a transceiver capable of operating in both of the described frequency bands.

It would appear to be a fairly straightforward task to construct such a transceiver wherein signals in the two bands are carried over separate paths within the transceiver. However, such a design would result in a duplication of much of the circuitry. Accordingly, there exists a need for a transceiver capable of operating in both of the described frequency bands in which much of the signal processing circuitry for the two bands is shared, to provide a more cost effective transceiver construction.

SUMMARY OF THE INVENTION

According to the present invention, a transceiver is constructed which uses a single voltage controlled local oscillator in an intermediate frequency stage for both the cellular and PCS signals. The oscillator is operative for upconverting transmitter signals and downconverting receive signals for both cellular operation and PCS operation. A second voltage controlled local oscillator in a stage between the transceiver antenna and the intermediate frequency stage is operative for only PCS operation to upconvert PCS transmitter signals and to downconvert PCS receive signals. This is accomplished by the use of a switchable intermediate frequency local oscillator in the transmitter path of both the cellular and PCS signals. This construction reduces by two the number of local oscillators required for the transmit and receive operations. In addition, the second voltage controlled local oscillator between the antenna and the intermediate frequency stage operates at a low frequency, thereby resulting in lower cost.

BRIEF DESCRIPTION OF THE DRAWINGS

The foregoing will be more readily apparent upon reading the following description in conjunction with the drawings wherein:

FIG. 2 is a table illustrating the oscillator operating frequencies for PCS channels for the inventive transceiver of FIG. 1.

DETAILED DESCRIPTION

Figure 1:
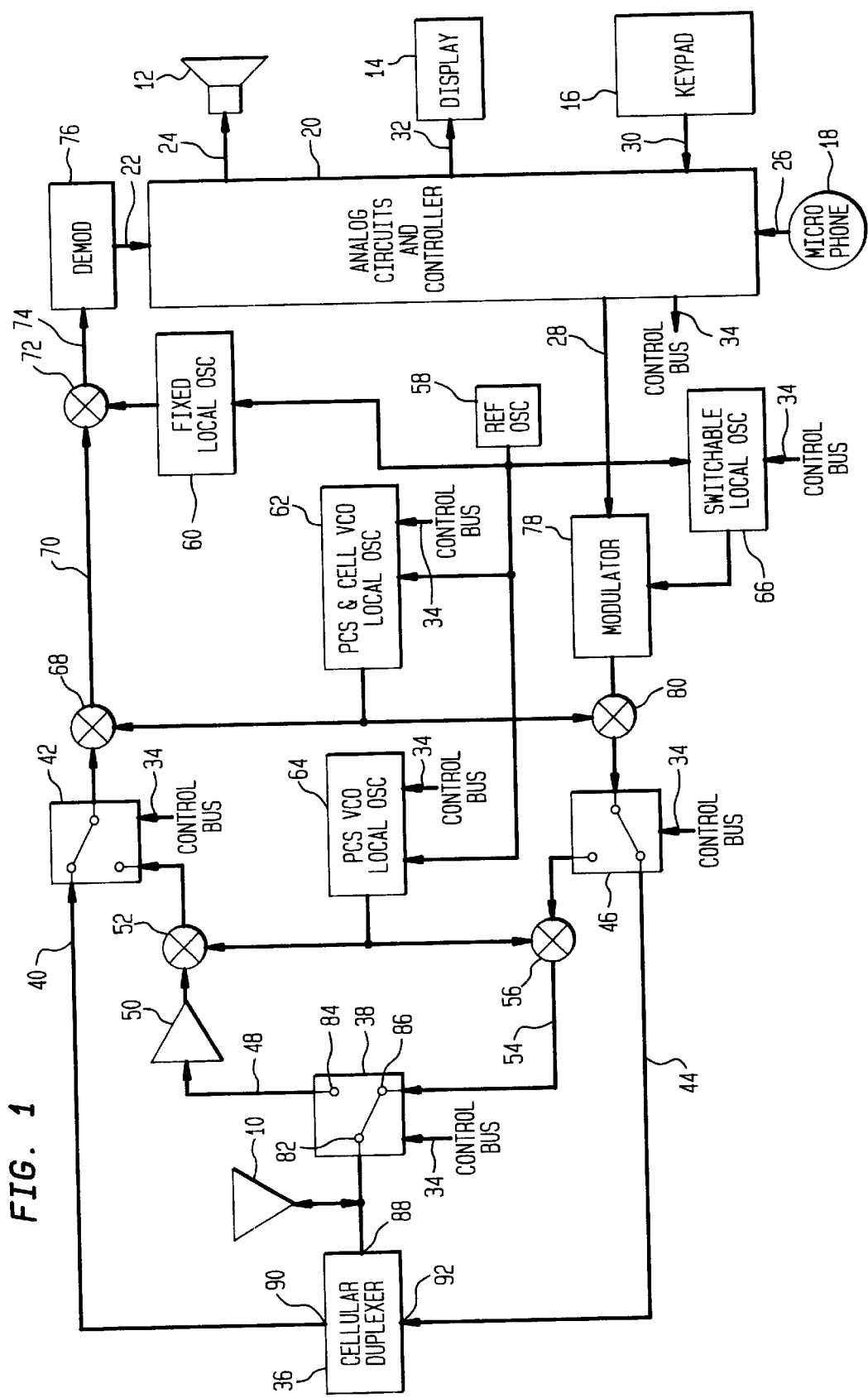
FIG. 1 is a schematic block diagram of a transceiver constructed in accordance with the principles of this invention for dual band cellular/PCS operation.

Referring now to the drawings, FIG. 1 shows a transceiver constructed for dual band cellular/PCS operation according to the present invention. The transceiver includes an antenna 10 which is operable over both the cellular and PCS bands. As is conventional, the transceiver includes a speaker 12, a display 14, a keypad 16 and a microphone 18, all connected to a circuit board 20 having thereon analog circuits and a microprocessor controller. As will be described in full detail hereinafter, the circuitry on the board 20 receives incoming demodulated communications signals over the leads 22 and applies them over the leads 24 to the speaker 12, receives incoming voice signals over the leads 26 from the microphone 18 and sends them out over the leads 28 for modulation, receives input control signals over the leads 30 from an operator via the keypad 16, provides visual information over the leads 32 to the operator via the display 14, and provides control signals over the control bus 34 to the various switches and controllable oscillators in the transceiver.

The antenna 10 is coupled to a duplexer 36 for the cellular band and to a TDMA switch 38, controllable by signals received over the control bus 34, for signals in the PCS band. The cellular receive signals on the lead 40 between the duplexer 36 and the switch 42 are in the frequency range from 869.04 MHz to 893.97 MHz. The transmit signals for cellular operation on the lead 44 between the switch 46 and the duplexer 36 are in the frequency range from 824.04 MHz to 848.97 MHz. The received PCS signals on the lead 48 from the switch 38 to the amplifier 50 and to the mixer 52 are in the frequency range from 1930.02 MHz to 1989.99 MHz. The PCS transmission signals on the lead 54 from the mixer 56 to the switch 38 are in the frequency range from 1850.01 MHz to 1909.95 MHz. The foregoing frequency ranges are conventional and are set by FCC regulations.

The reference oscillator 58, preferably a temperature compensated crystal oscillator operating at a frequency of 19.44 MHz, provides a reference frequency signal for use by the fixed local oscillator 60, the first voltage controlled local oscillator 62, the second voltage controlled local oscillator 64, and the switchable intermediate frequency local oscillator 66. According to the present invention, the fixed local oscillator 60 operates at a frequency of 81.75 MHz. The local oscillator 62 is controllable in 30 KHz steps to operate in the frequency range from 951.24 MHz to 976.17 MHz for cellular operation and in the frequency range from 976.32 MHz to 976.47 MHz for PCS operation. The local oscillator 64 is only utilized for PCS operation and is controllable in 0.18 MHz steps to operate in the frequency range from 1035.90 MHz to 1095.84 MHz. The switchable local oscillator 66 is controllable to operate at a frequency of 127.20 MHz for cellular operation and at a frequency of 162.24 MHz for PCS operation.

The mixer 52 utilizes the output of the oscillator 64 to operate as a first downconverter to downconvert PCS signals received by the antenna 10 to a frequency range above the cellular band, particularly to the frequency range from 894.12 MHz to 894.27 MHz. The mixer 68 utilizes the output of the oscillator 62 to operate as a second downconverter to downconvert cellular signals received by the antenna 10 and the previously downconverted PCS signals to an intermediate frequency signal at 82.2 MHz on the lead 70. The mixer 72 utilizes the output of the oscillator 60 to downconvert the signal on the lead 70 to an intermediate frequency signal at 450 KHz on the lead 74 to the demodulator 76. The output of the demodulator 76 is provided to the circuitry 20 for application to the speaker 12.

Signals from the microphone 18 which appear on the lead 28 are modulated by the modulator 78 which utilizes the output of the switchable oscillator 66. Thus, for cellular operation, the modulator 78 uses the output of the oscillator 66 at 127.20 MHz and for PCS operation uses the output of the oscillator 66 at 162.24 MHz. The different frequencies of the oscillator 66 are needed because of the different transmit/receive frequency spacing for cellular and PCS operation. The output of the modulator 78 is provided to the mixer 80, which utilizes the output of the oscillator 62 to function as a first upconverter to upconvert signals for cellular transmission to the cellular band in a frequency range from 824.04 MHz to 848.97 MHz for radiation by the antenna 10 and to upconvert signals for PCS transmission to a frequency range below the cellular band, specifically to the frequency range from 814.08 MHz to 814.23 MHz. The PCS signals are provided to the mixer 56 which utilizes the output of the oscillator 64 to operate as a second upconverter to upconvert the previously upconverted PCS signals to the PCS band in the frequency range from 1850.01 MHz to 1909.95 MHz for radiation by the antenna 10.

Thus, as shown, the TDMA switch 38 has first terminals 82 coupled to the antenna 10, second terminals 84 coupled to the first downconverter (the mixer 52) and third terminals 86 coupled to the second upconverter (the mixer 56), with the switch 38 being operative to respond to appropriate signals received over the control bus 34 for selectively connecting the first terminals 82 either to the second terminals 84 or the third terminals 86, thereby providing a multiplexing function for the PCS transmit and receive signals. The cellular duplexer 36 has first terminals 88 coupled to the antenna 10, second terminals 90 operative to couple received cellular signals to the second downconverter (the mixer 68) and third terminals 92 operative to couple signals from the first upconverter (the mixer 80) to the antenna 10.

The switch 42 operates in response to signals received over the control bus 34 to selectively connect the second downconverter (the mixer 68) to the duplexer 36 second terminals 90 for cellular operation or to the first downconverter (the mixer 52) for PCS operation. The switch 46 operates in response to signals received over the control bus 34 for selectively connecting the first upconverter (the mixer 80) to the duplexer 36 third terminals 92 for cellular operation or to the second downconverter (the mixer 56) for PCS operation. The switches 42, 46 are controlled concurrently to both be effective either for cellular operation or for PCS operation.

As shown in FIG. 1, a single voltage controlled oscillator 62 is utilized for both the transmitter signals and received signals for both cellular operation and PCS operation, and a single voltage controlled local oscillator 64 is used for both transmitter signals and received signals for PCS operation. This is accomplished through the use of the switchable local oscillator 66 and allows the local oscillator 64 to be of cost effective low frequency (i.e., around 1 GHz) which is used for both upconverting the transmitter signals and downconverting the received signals for PCS operation. It is noted that the circuitry to the right of the mixers 68 and 80 is shared for both cellular and PCS operation. This is accomplished by bringing both the cellular and PCS received signals to the same intermediate frequency (i.e., 82.2 MHz). The cellular and PCS intermediate frequency bands at the input to the mixer 68 and at the output from the mixer 80 are slightly offset to prevent interaction of cellular service with a PCS call.

All of the foregoing is performed as a result of the choice of frequencies of the oscillators 62 and 64 and the manner in which they are stepped through their ranges. Referring to the table of FIG. 2, shown therein are the various frequencies according to this invention for the PCS channels 4–12. Thus, the second and third columns show the transmit and receive frequencies, respectively, set by the FCC for PCS operation in the channel identified in the first column. The fourth column shows for each channel the upconverted PCS transmitter frequency at the output of the mixer 80. These signals vary from 814.08 MHz to 814.23 MHz in 30 KHz steps, repeating every six channels. The fifth column shows the frequency of the oscillator 64 which is controlled in 0.18 MHz steps every six channels. The sixth column shows the downconverted PCS received signal frequency at the input to the mixer 68 which varies from 894.12 MHz to 894.27 MHz in 30 KHz steps, repeating every six channels. The last column shows the frequency of the oscillator 62 which varies from 976.32 MHz to 976.47 MHz in 30 KHz steps, repeating every six channels. Thus, the transceiver controller is operative to control the oscillator 62 to step through its PCS band of operation in 30 KHz steps for the PCS channels within a group of six adjacent PCS channels; the controller is operative to control the oscillator 64 to operate at the same frequency for each PCS channel within that group of six adjacent PCS channels; and the controller is operative to j control the oscillator 64 to step through its band of operation in 0.18 MHz steps for each group of six adjacent PCS channels. Although only channels 4–12 are illustrated in the table of FIG. 2, it is understood that this frequency allocation sequence extends over all of the 1999 PCS channels.

Accordingly, there has been disclosed an improved transceiver operable in both the cellular and PCS frequency bands. While a preferred embodiment of the present invention has been disclosed herein, it will be apparent to one of ordinary skill in the art that various modifications and adaptations to the disclosed embodiment are possible and it is intended that this invention be limited only by the scope of the appended claims.

What is claimed is:

1. A transceiver arranged for dual-band operation to process signals in the cellular telephone frequency band of from about 824 MHz to about 894 MHz and in the personal communications services (PCS) frequency band of from about 1850 MHz to about 1990 MHz, comprising:

an antenna operable over both the cellular and the PCS frequency bands;

an intermediate frequency local oscillator in the transmitter path of both the cellular and PCS signals, the intermediate frequency local oscillator being switchable to operate at a first frequency for cellular operation and at a second frequency for PCS operation;

a first voltage controlled local oscillator in an intermediate frequency stage for both cellular and PCS signals and operative to upconvert transmitter signals and to downconvert received signals for both cellular operation and PCS operation;

a second voltage controlled local oscillator in a stage between said antenna and said intermediate frequency stage for only PCS operation and operative to upconvert PCS transmitter signals and to downconvert PCS received signals; and a controller operative to control the operation of said intermediate frequency local oscillator, said first voltage controlled local oscillator and said second voltage controlled local oscillator.

2. The transceiver according to claim 1 wherein:

said controller is operative to control said switchable intermediate frequency local oscillator to operate at a frequency of 127.20 MHz for cellular operation and at a frequency of 162.24 MHz for PCS operation;

said controller is operative to control said first voltage controlled local oscillator in 30 KHZ steps between 951.24 MHz and 976.17 MHz for cellular operation and between 976.32 MHz and 976.47 MHz for PCS operation; and said controller is operative to control said second voltage controlled local oscillator in 0.18 MHz steps between 1035.90 MHz and 1095.84 MHz;

the controller functioning so that received PCS signals in the frequency range from 1930.02 MHz to 1989.99 MHz are downconverted to the frequency range from 894.12 MHz to 894.27 MHz, received cellular signals and the downconverted PCS signals are downconverted to 82.2 MHz, signals for PCS transmission are upconverted to the frequency range from 814.08 MHz to 814.23 MHz and then to the frequency range from 1850.01 MHz to 1909.95 MHz, and signals for cellular transmission are upconverted to the frequency range from 824.04 MHz to 848.97 MHz.

3. The transceiver according to claim 2 wherein the PCS channels are at 30 KHZ intervals and for PCS operation:

said controller is operative to control said first voltage controlled local oscillator to step through its PCS band of operation for the PCS channels within a group of six adjacent PCS channels;

said controller is operative to control said second voltage controlled local oscillator to operate at the same frequency for each PCS channel within said group of six adjacent PCS channels; and said controller is operative to control said second voltage controlled local oscillator to step through its band of operation for each group of six adjacent PCS channels.

4. A transceiver arranged for dual-band operation in the cellular telephone frequency band of from about 824 MHz to about 894 MHz and in the personal communications services (PCS) frequency band of from about 1850 MHz to about 1990 MHz, the transceiver comprising:

an antenna operable over both the cellular and the PCS frequency bands;

an intermediate frequency local oscillator controllably switchable to operate at a first frequency for cellular operation and at a second frequency for PCS operation;

a first voltage controlled local oscillator controllable in steps of a first size;

a second voltage controlled local oscillator controllable in steps of a second size;

a first downconverter utilizing said second voltage controlled local oscillator to downconvert PCS signals received by said antenna to a frequency range above said cellular band;

a second downconverter utilizing said first voltage controlled local oscillator to downconvert cellular signals received by said antenna and said downconverted PCS signals to a single intermediate frequency;

a first upconverter utilizing said intermediate frequency local oscillator and said first voltage controlled local oscillator to upconvert signals for cellular transmission to said cellular band for radiation by said antenna and to upconvert signals for PCS transmission to a frequency range below said cellular band;

a second upconverter utilizing said second voltage controlled local oscillator to upconvert said upconverted PCS signals to said PCS band for radiation by said antenna; and a controller operative to control the operation of said intermediate frequency local oscillator, said first voltage controlled local oscillator and said second voltage controlled local oscillator.

5. The transceiver according to claim 4 further comprising:

a TDMA switch controllable by said control means and including first terminals coupled to said antenna, second terminals coupled to said first downconverter and third terminals coupled to said second upconverter, said controller being operative for selectively connecting said first terminals either to said second terminals or to said third terminals;

a duplexer coupled to said antenna for cellular operation and including first terminals coupled to said antenna, second terminals coupling cellular signals received by said antenna to said second downconverter and third terminals coupling signals from said first upconverter to said antenna;

a first switch controllable by said controller for selectively connecting said second downconverter to said duplexer second terminals for cellular operation or to said first downconverter for PCS operation; and a second switch controllable by said controller for selectively connecting said first upconverter to said duplexer third terminals for cellular operation or to said second downconverter for PCS operation;

wherein said controller is effective to control said first and second switches concurrently to both be effective either for cellular operation or for PCS operation.

6. The transceiver according to claim 5 wherein:

said controller is operative to control said switchable intermediate frequency local oscillator to operate at a frequency of 127.20 MHz for cellular operation and at a frequency of 162.24 MHz for PCS operation;

said controller is operative to control said first voltage controlled local oscillator in 30 KHZ steps between 951.24 MHz and 976.17 MHz for cellular operation and between 976.32 MHz and 976.47 MHz for PCS operation; and said controller is operative to control said second voltage controlled local oscillator in 0.18 MHz steps between 1035.90 MHz and 1095.84 MHz;

the controller functioning so that received PCS signals in the frequency range from 1930.02 MHz to 1989.99 MHz are downconverted to the frequency range from 894.12 MHz to 894.27 MHz, received cellular signals and the downconverted PCS signals are downconverted to 82.2 MHz, signals for PCS transmission are upconverted to the frequency range from 814.08 MHz to 814.23 MHz and then to the frequency range from 1850.01 MHz to 1909.95 MHz, and signals for cellular transmission are upconverted to the frequency range from 824.04 MHz to 848.97 MHz.

7. The transceiver according to claim 6 wherein the PCS channels are at 30 KHZ intervals and for PCS operation:

said controller is operative to control said first voltage controlled local oscillator to step through its PCS band of operation for the PCS channels within a group of six adjacent PCS channels;

said controller is operative to control said second voltage controlled local oscillator to operate at the same frequency for each PCS channel within said group of six adjacent PCS channels; and said controller is operative to control said second voltage controlled local oscillator to step through its band of operation for each group of six adjacent PCS channels.

* * * * *